United States Patent
Endou

(10) Patent No.: US 8,004,285 B2
(45) Date of Patent: Aug. 23, 2011

(54) LEAKAGE DETECTION DEVICE OF VEHICLE MOUNTED POWER SUPPLY SYSTEM

(75) Inventor: Takayoshi Endou, Hiratsuka (JP)

(73) Assignee: Komatsu Ltd., Tokyo (JP)

( * ) Notice: Subject to any disclaimer, the term of this patent is extended or adjusted under 35 U.S.C. 154(b) by 865 days.

(21) Appl. No.: 11/988,540

(22) PCT Filed: Jul. 11, 2006

(86) PCT No.: PCT/JP2006/313763
§ 371 (c)(1),
(2), (4) Date: Jan. 10, 2008

(87) PCT Pub. No.: WO2007/007749
PCT Pub. Date: Jan. 18, 2007

(65) Prior Publication Data
US 2009/0121672 A1    May 14, 2009

(30) Foreign Application Priority Data
Jul. 12, 2005 (JP) .................. 2005-203242

(51) Int. Cl.
G01R 31/08 (2006.01)
G01R 31/00 (2006.01)
G01R 19/00 (2006.01)
H02J 7/00 (2006.01)
H02H 3/00 (2006.01)

(52) U.S. Cl. ........... 324/522; 320/127; 361/42; 361/86; 702/58; 702/59; 702/64; 324/503

(58) Field of Classification Search .................. 320/104, 320/127, 165; 307/10.1, 10.7; 180/65.1–65.8; 903/906, 907; 361/42, 49, 78, 79, 86, 88
See application file for complete search history.

(56) References Cited

U.S. PATENT DOCUMENTS
2002/0121902 A1* 9/2002 Suzuki .................. 324/509
2009/0121672 A1* 5/2009 Endou .................. 320/104

FOREIGN PATENT DOCUMENTS
JP         7-241002         9/1995
(Continued)

OTHER PUBLICATIONS
International Search Report issued Aug. 22, 2006 in the International (PCT) Application of which the present application is the U.S. National Stage.
(Continued)

*Primary Examiner* — Richard V Muralidar
(74) *Attorney, Agent, or Firm* — Wenderoth, Lind & Ponack, L.L.P.

(57) ABSTRACT

A leakage detection can be correctly performed both in a DC high voltage circuit and in an AC high voltage circuit in a vehicle-mounted power supply system. Under a state where a contactor 17 is turned off, all IGBT elements (switching elements) 76 in an IGBT inverter circuit 12 are turned on, and an AC signal Vs is applied to an applying point P. Then, a voltage measured at a voltage measurement point Q is compared with a threshold value to detect whether or not the leakage exists.

8 Claims, 8 Drawing Sheets

FOREIGN PATENT DOCUMENTS

| | | |
|---|---|---|
| JP | 8-70503 | 3/1996 |
| JP | 2000-13902 | 1/2000 |
| JP | 2000-013902 * | 1/2000 |
| JP | 2002-209331 | 7/2002 |
| JP | 2003-219551 | 7/2003 |
| JP | 2003-223841 | 8/2003 |

OTHER PUBLICATIONS

Japanese Patent Office Refusing Reason Notice (with English translation) issued Feb. 9, 2010 in corresponding Japanese Patent Application No. 2007-524655.

* cited by examiner

LEAKAGE DETECTION DEVICE OF VEHICLE MOUNTED POWER SUPPLY SYSTEM

TECHNICAL FIELD

The present invention relates to a leakage detection device of a vehicle-mounted power supply system that converts a direct current power supplied from a battery to an alternating current power with an electric power conversion circuit, and supplies the converted alternating current to an AC motor.

BACKGROUND ART

In recent years, there have been developed vehicles such as hybrid vehicles that drive using, in whole or in part, the electric power supply from the battery as a power source. Most of these vehicles have a power supply system that converts a direct current power supplied from a battery to an alternating current power using an inverter or other electric power conversion circuit, and supplies the converted alternating current power to an AC motor or other loads.

The battery used in the power supply system provides a high voltage and has a large capacity. Thus, if an electrical leakage arises in any part of the electric circuit, there is a possibility of such trouble as an electric shock to an engineer who performs maintenance of vehicle. For this reason, it is required for the vehicle-mounted power supply system to detect the electric leakage as soon as possible, and in case of detecting the leakage, a necessary countermeasure should be immediately taken.

FIG. 6 is a diagram showing a conventional leakage detection device of the vehicle-mounted power supply system. Such leakage detection device is disclosed in the Patent Literature 1 below.

In FIG. 6, the leakage detection device comprises a power supply system 10 and a leakage detection section 20.

The power supply system 10 comprises a DC high voltage circuit A and an AC high voltage circuit B. The DC high voltage circuit A comprises a battery 11 for the direct current, a positive line 13 and a negative line 14 that are connected respectively to positive and negative sides of the battery 11, and contactors 17a, 17b that are provided on the positive line 13 and the negative line 14, the contactors 17a, 17b being connected respectively to the positive line 13 and the negative line 14. The AC high voltage circuit B comprises an inverter circuit 12 that is connected to the positive line 13 and the negative line 14 and converts the direct current power to the alternating current power by switching on/off plural switching elements, an AC motor 15, and plural AC lines 16 that connect the inverter 12 with the AC motor 15.

To activate the AC motor 15, the contactors 17a, 17b are turned on.

The inverter 12 is, for example, an IGBT inverter circuit 12 as shown in FIG. 7. The IGBT inverter circuit is provided with six IGBT elements (switching elements) 76 and six IGBT circuits 70-75 having corresponding six diodes 77.

When the AC motor 15 is a three-phase motor, three sets of circuits, the IGBT circuits 70, 73, the IGBT circuits 71, 74 and the IGBT circuits 72, 75, are connected in parallel. Additionally, an intermediate point M1 between the IGBT circuits 70, 73, an intermediate point M2 between the IGBT circuits 71, 74 and an intermediate point M3 between the IGBT circuits 72, 75 are respectively connected to three coils in the AC motor 15.

The leakage detection section 20 comprises a capacitor C that is connected to a voltage applying point P on the positive line 13 connected to the positive side of the battery, a resistance R that is connected to the capacitor C, an oscillator 21 that generates an AC signal Vs with a prescribed frequency such as a sine wave or a square wave and provides the AC signal Vs to the resistance R, and a voltage measurement section 40 that measures a voltage level (effective value of the AC voltage) at a voltage measurement point Q located between the resistance R and the capacitor C. While the voltage measurement section 40 measures the voltage level, a threshold value is set to determine whether or not the leakage exists.

A process of detecting the leakage in the leakage detection section 20 shown in FIG. 6 is performed as follows.

It is assumed that the insulation of the negative line 14 becomes deteriorated and leakage occurs therein.

The AC signal Vs outputted from the oscillator 21 passes through the resistance R and the capacitor C, and is applied to the applying point P on the positive line 13.

If no leakage exists in the power supply system 10, the effective value of voltage measured by the voltage measuring section 40 is substantially the same as the effective value of voltage of the AC signal Vs outputted from the oscillator 21, and equals or exceeds a set threshold value. Accordingly, it is determined that the leakage does not exist.

On the other hand, if the leakage exists in the power supply system 10, in other words, if the leakage exists in the negative line 14, there occurs a leakage resistance r between the negative line 14 and the body (earth) of the vehicle. Thus, the effective value of voltage of the AC signal Vs is divided to the resistance R and the leakage resistance r. Therefore, the effective value of voltage measured with the voltage measuring section 40 is smaller than the effective value of voltage of the AC signal Vs outputted from the oscillator 21, and is lower than the set threshold value. Accordingly, it is determined that the leakage exists. As described above, by measuring the voltage at the measurement point Q and comparing the measured voltage with the threshold value, it can be detected whether or not the leakage exists.

Patent Literature 1: Japanese Patent Application Laid-open No. 2003-219551

SUMMARY OF THE INVENTION

Problems to be Solved by the Invention

In the conventional leakage detection device, however, there is a problem that, among the leakage occurring in the power supply system 10, the leakage in the DC high voltage circuit A can be detected, but that in the AC high voltage circuit B cannot be detected. With reference to FIGS. 6 and 7, a reason that the leakage occurring in the AC high voltage circuit cannot be detected will be described.

It is assumed that the insulation of any of the AC lines 16a-16c in the AC high voltage circuit becomes deteriorated and the leakage occurs therein.

If the leakage is detected, because the AC motor 15 does not perform a normal control, a gate 76 in each of the IGBT elements in the AC high voltage circuit B is turned off. Thus, half waves in the AC signal Vs, namely, a signal directing to one direction can be passed through each of the diodes 77 and be transmitted to the AC lines 16a-16c, while the remaining half wave, namely, a signal directing to the opposite direction is stopped at each of the IGBT circuits 70-75 because the signal of the opposite direction cannot flow through the diodes 77. As a result, regardless of whether or not the leakage exists in the AC lines 16a-16c, it is determined that no leakage exists, and whether or not the leakage exists cannot be correctly determined.

As described above, in the conventional leakage detection device, detecting the leakage can be performed only for the DC high voltage circuit A in the power supply system 10, and the leakage in the AC high voltage circuit B cannot be correctly detected.

However, if the leakage detection in the power supply system 10 is limited only for the DC high voltage circuit A and is not performed for the AC high voltage circuit B, there arises a problem at the time of maintaining the leaked part.

The present invention is made in view of the problem as described above, and the object of the present invention is to correctly detect the leakage occurring in both the DC high voltage circuit A and the AC high voltage circuit B in the vehicle-mounted power supply system.

Means to Solve the Problems

To achieve the object as described above, a first aspect of the present invention provides a leakage detection device of a power supply system, in which a leakage in the power supply system is detected by a leakage detection section, the power supply system comprising: a battery for a direct current; an electric power conversion circuit that converts a direct current power of the battery to an alternating current power by turning on/off a plurality of switching elements, and outputs the converted alternating current power to an AC motor; a positive line and a negative line that connect the battery and the electric power conversion circuit; and a contactor that is provided on the positive line or the negative line, wherein the leakage detection section comprises: a switching element control section that outputs a switching signal for detecting the leakage to the switching elements in the electric power conversion circuit; AC voltage applying means that applies an AC voltage to a voltage applying point on the positive line or the negative line in the power supply system; voltage measurement means that measures a voltage at a voltage measurement point located between the AC voltage and the voltage applying point; and leakage detection means that turns on all positive-side switching elements or all negative-side switching elements in the electric power conversion circuit while the contactor is turned off, and detects whether or not the leakage exists in the power supply system on the basis of a voltage value at the voltage measurement point at this time.

A second aspect of the present invention provides the leakage detection device according to the first aspect of the present invention, wherein, when an operation for activating a vehicle is performed, all the switching elements in the power conversion circuit are turned on while the contactor is turned off; it is detected whether or not the leakage exists in the power supply system; and, after it is detected whether or not the leakage exists in the power supply system, the contactor is turned on, and a control of the switching elements in the electric power conversion circuit is moved to a normal control.

A third aspect of the present invention provides the leakage detection device according to the first aspect of the present invention, wherein, when an operation for stopping a vehicle from working is performed, all the switching elements in the power conversion circuit are turned on while the contactor is turned off; it is detected whether or not the leakage exists in the power supply system; and after it is detected whether or not the leakage exists in the power supply system, the vehicle is stopped from working.

A fourth aspect of the present invention provides the leakage detection device according to the second aspect of the present invention, wherein, only if the leakage is not detected by the leakage detection means, the control of the switching elements in the electric power conversion circuit is moved to the normal control.

A fifth aspect of the present invention provides the leakage detection device according to the first aspect of the present invention, wherein, if the leakage is detected by the leakage detection means, all the switching elements in the electric power conversion circuit are turned off; it is detected whether or not the leakage exists in the power supply system on the basis of the voltage value at the voltage measurement point at this time; as a result, if the leakage is detected, it is determined that the leakage exists before the electric power conversion circuit; and if the leakage is not detected, it is determined that the leakage exists in the electric power conversion circuit or after.

A sixth aspect of the present invention provides a leakage detection device of a power supply system, in which a leakage in the power supply system is detected by a leakage detection section, the power supply system comprising: a battery for a direct current; an electric power conversion circuit that converts a direct current power of the battery to an alternating current power by turning on/off a plurality of switching elements, and outputs the converted alternating current power to an AC motor; a positive line and a negative line that connect the battery and the electric power conversion circuit; and a contactor that is provided on the positive line or the negative line, wherein the leakage detection section comprises: a switching element control section that outputs a switching signal for detecting the leakage to the switching elements in the electric power conversion circuit; AC voltage applying means that applies an AC voltage to a voltage applying point on the positive line or the negative line in the power supply system; voltage measurement means that measures a voltage at a voltage measurement point located between the AC voltage and the voltage applying point; and leakage detection means that, when an instruction to detect the leakage is given while a vehicle is in operation, stops the AC motor; turns on all positive-side switching elements or all negative-side switching elements in the electric power conversion circuit while the contactor is turned on; and detects whether or not the leakage exists in the power supply system on the basis of a voltage value at the voltage measurement point at this time.

A seventh aspect of the present invention provides the leakage detection device according to the sixth aspect of the present invention, wherein, if the leakage is detected by the leakage detection means, all the switching elements in the electric power conversion circuit are turned off while the contactor is turned off, and it is detected whether or not the leakage exists in the power supply system on the basis of the voltage value at the voltage measurement point at this time; as a result, if the leakage is detected, it is determined that the leakage exists before the electric power conversion circuit; and if the leakage is not detected, it is determined that the leakage exists in the electric power conversion circuit or after.

An eighth aspect of the present invention provides a leakage detection method of a vehicle-mounted power supply system, for detecting a leakage in the power supply system comprising a DC high voltage circuit and an AC high voltage circuit, the method comprising the steps of: turning off a contactor provided on a positive line or a negative line in the DC high voltage circuit; generating an AC voltage signal by an AC voltage generator; turning on all positive-side switching elements or all negative-side switching elements in an electric power conversion circuit provided in the AC high voltage circuit to electrically connect all circuits in the power supply system; applying the AC voltage signal generated by the AC voltage generator to an voltage applying point on the positive line or the negative line; measuring a voltage at a voltage measurement point located between the AC voltage generator and the voltage applying point; and detecting whether or not the leakage exists in the power supply system on the basis of the voltage value measured at the voltage measurement point.

A ninth aspect of the present invention provides the leakage detection method according to the eighth aspect of the present invention, the method further comprising the steps of: detecting the leakage at the time when an operation for activating a vehicle is performed; turning on the contactor after it is detected whether or not the leakage exists in the power supply system; and moving a control of the switching elements in the electric power conversion circuit to a normal control.

A tenth aspect of the present invention provides the leakage detection method according to the eighth aspect of the present invention, the method further comprising the steps of: detecting the leakage at the time when an operation for stopping a vehicle from working is performed; and stopping the vehicle from working after it is detected whether or not the leakage exists in the power supply system.

According to the first aspect of the present invention, in a state where the contactor 17 is turned off, the IGBT element (switching element) 76 in the IGBT inverter circuit 12 is turned on (S35), and the AC signal Vs is applied to the applying point P (step S36).

By comparing the measured voltage at the voltage measurement point Q with the threshold value, it is detected whether or not the leakage exists (step S37).

Since all the gates in the IGBT circuits 70-75 are turned on, the AC signal Vs is transmitted through both directions in the IGBT circuits 70-75 in the AC high voltage circuit B, and full waves of the AC signal Vs are transmitted to the AC lines 16a-16c. In other words, unlike the conventional art, it does not occur in the first aspect of the present invention that, although the half wave of the AC signal Vs, i.e., the signal directing to one direction can be passed through each of the diodes 77 and be transmitted to the AC lines 16a-16c, the remaining half wave, i.e., a signal directing to the opposite direction is stopped at each of the diodes 77, and is blocked at each of the IGBT circuits 70-75.

If the leakage (leakage resistance r) does not occur in the DC high voltage circuit A, the effective value of voltage measured at the voltage measurement point Q is substantially the same as the effective value of voltage of the AC signal Vs, and it is determined that the measured voltage equals or exceeds the set threshold value. Accordingly, it is determined that the leakage does not exist.

On the other hand, if the leakage exists in the DC high voltage circuit A, for example, if the leakage (leakage resistance r) exists in the negative line 14, the effective value of voltage of the AC signal Vs is divided to the resistance R and the leakage resistance r. Thus, the effective value of voltage measured at the voltage measurement point Q is smaller than that of the AC signal Vs, and it is determined that the measured voltage is lower than the set threshold value. Accordingly, it is determined that the leakage exists.

If the leakage (leakage resistance r) does not occur in the AC high voltage circuit B, the AC signal Vs flows through the IGBT circuits 70-75 in the AC high voltage circuit B in both directions, and full waves of the AC signal Vs are transmitted to the AC lines 16a-16c. Thus, the effective value of voltage measured at the voltage measurement point Q is substantially the same as the effective value of voltage of the AC signal Vs, and it is determined that the measured voltage equals or exceeds the set threshold value. Accordingly, it is determined that the leakage does not occur.

On the other hand, if the leakage exists in the AC high voltage circuit B, for example, if the leakage (leakage resistance r) exists in the AC lines 16a-16c, the effective value of voltage of the AC signal Vs is divided to the resistance R and the leakage resistance r. Thus, the effective value of voltage measured at the voltage measurement point Q is smaller than that of the AC signal Vs, and it is determined that the measured voltage is lower than the set threshold value. Accordingly, it is determined that the leakage exists.

As described above, according to the first aspect of the present invention, not only the existence/absence of the leakage in the DC high voltage circuit A, but also the existence/absence of the leakage in the AC high voltage circuit B can be correctly detected.

In the second aspect of the present invention, when operation (turning on the ignition) for activating the vehicle is performed (S30), in a state where the contactor 17 is turned off, each of the IGBT elements (switching elements) 76 in the IGBT inverter circuit 12 is turned on (S35), and it is detected whether or not the leakage exists in the power supply system 10 (S37). Then, after it is detected whether or not the leakage exists in the power supply system 10, the contactor 17 is turned on (S44), and control of the IGBT elements (switching elements) 76 in the inverter circuit 12 is moved to the normal control.

According to the second aspect of the present invention, the leakage detection is performed at the time of activating the vehicle. As a result, the leakage can be detected without deteriorating operation efficiency of the vehicle and efficiency of work made by the vehicle.

According to the fourth aspect of the present invention, only if the leakage is not detected (N in S37), control of the IGBT element (switching element) 76 in the IGBT inverter circuit 12 is moved to the normal control (S43, S44, normal control).

According to the fourth aspect of the present invention, only if the leakage is not detected at the time of activating the vehicle, the control is moved to the normal control, and the vehicle is made in full operation. As a result, a case where the vehicle is operated while the leakage exists can be avoided, and safety can be ensured.

According to the fifth aspect of the present invention, if the leakage is detected (Y in step S37), a process of determining the location where the leakage occurs is implemented.

Specifically, by turning off all the gates in the IGBT circuits 70-75 in the inverter circuit 12 (step S38), the AC high voltage circuit B and the DC high voltage circuit A are electrically shut off.

Next, the AC voltage Vs is applied again to the applying point P, and the voltage level at the measurement point Q is measured. And, by comparing the measured voltage with the threshold value in the leakage detection section 53, it is detected whether or not the leakage exists (step S39).

As a result, if the leakage is not detected, "leakage is detected" under a state where the AC high voltage circuit B and the DC high voltage circuit A are electrically connected, while "leakage is not detected" under a state where the AC high voltage circuit B and the DC high voltage circuit A are electrically shut off. Thus, it is determined that the leakage detected in the step S37 occurs on the side of the AC high voltage circuit B (N in step S39, step S40).

On the other hand, if the leakage is detected, "leakage is detected" under a state where the AC high voltage circuit B and the DC high voltage circuit A are electrically connected, while "leakage is detected" under a state where the AC high voltage circuit B and the DC high voltage circuit A are electrically shut off. Thus, it is determined that the leakage detected in the step S37 occurs on the side of the DC high voltage circuit A (Y in step S39, step S41).

According to the fifth aspect of the present invention, whether the leakage occurs in the AC high voltage circuit B or in the DC high voltage circuit A can be identified. Thus, the maintenance of the location of the leakage can be immediately performed, whereby the operation efficiency can be improved.

According to the third aspect of the present invention, when operation (turning off the ignition) for stopping the vehicle from working is performed (S50), as is the case with the first aspect of the present invention, in a state where the contactor 17 is turned off, all the IGBT elements (switching element) 76 in the inverter circuit 12 are turned on (S51, S54), and it is detected whether or not the leakage exists in the power supply system 10 (S57). Then, after it is detected whether or not the leakage exists in the power supply system, the vehicle is stopped from working (S62).

According the third aspect of the present invention, the leakage detection is performed at the time of stopping the vehicle from working. Thus, the leakage can be detected without deteriorating the operation efficiency of the vehicle and efficiency of work made by the vehicle. Additionally, maintenance can be implemented while the vehicle is not in operation, whereby repairing operation can be completed by the time when the vehicle starts its next operation. Accordingly, the operation schedule is not delayed by the maintenance operation required by the leakage.

The fifth aspect of the present invention as described above provides a configuration in which, while all the IGBT elements (switching elements) 76 in the IGBT inverter circuit 12 are turned on in a state where the contactor 17 is turned off, it is detected whether or not a leakage exists; as a result, if the leakage is detected, all the IGBT elements (switching elements) 76 in the IGBT inverter circuit 12 are turned off, and it is detected whether or not the leakage exists; as a result, if the leakage is detected, it is determined that the leakage occurs before the inverter circuit 12, i.e., on the side of the DC high voltage circuit A; and, on the other hand, if the leakage is not detected, it is determined that the leakage occurs in the inverter circuit 12 or after, i.e., on the side of the AC high voltage circuit B.

In the sixth aspect of the present invention, when an instruction to detect the leakage is given during which the vehicle is in operation, the AC motor 15 is stopped (S70). And, while, in a state where the contactor 17 is turned on, all the IGBT elements (switching elements) 76 on the positive side of the IGBT inverter circuit 12 are turned on, or, all the IGBT elements (switching elements) 76 on the negative side are turned on (S71), it is detected whether or not the leakage exists (S74). As described above, by turning on all the IGBT elements (switching elements) 76 on the positive side of the IGBT inverter circuit 12, or, by turning on all the IGBT elements (switching elements) 76 on the negative side in the state where the contactor 17 is turned on, the AC signal Vs flows through the IGBT circuits 70-75 in the AC high voltage circuit B in both directions, as is the case with the first aspect of the present invention. Accordingly, not only whether or not the leakage exists in the DC high voltage circuit, but also whether or not the leakage exists in the AC high voltage circuit can be correctly detected.

In the seventh aspect of the present invention, when an instruction to detect the leakage is given during which the vehicle is in operation, the AC motor 15 is stopped (S70). And, while, in a state where the contactor 17 is turned on, all the IGBT elements (switching elements) 76 on the positive side of the IGBT inverter circuit 12 are turned on, or, all the IGBT elements (switching elements) 76 on the negative side are turned on (S71), it is detected whether the leakage occurs (S74). As a result, if the leakage is detected (Y in S74), while all the IGBT elements (switching elements) 76 in the IGBT inverter circuit 12 are turned off (S75, S76) in a state where the contactor 17 is turned off, it is detected whether or not the leakage exists (S76). As a result, if the leakage is detected, it is determined that the leakage occurs before the inverter circuit 12, i.e., on the side of the DC high voltage circuit A. On the other hand, if the leakage is not detected, it is determined that the leakage occurs in the inverter circuit 12 or after, i.e., on the side of the AC high voltage circuit B (S77, S78).

According to the seventh aspect of the present invention, as is the case with the fifth aspect, whether the leakage occurs in the AC high voltage circuit B or in the DC high voltage circuit A can be identified. Accordingly, the leaked part can be immediately repaired, whereby the work efficiency can be improved.

The eighth aspect of the present invention provides a leakage detection method roughly comprising six steps. The six steps above will be described with reference to a configuration shown in FIG. 1 and a process procedure shown in FIG. 3 in First Embodiment.

(1) Step of Turning Off the Contactor

In First Embodiment, the contactor 17 is turned off at the time when operation for stopping the vehicle from working is performed. Thus, even if the ignition is turned on (step S30), the contactor 17 maintains the turned off position.

(2) Step of Generating the AC Voltage Signal

Next, when the ignition is turned on (step S30), an electronic control unit 50 is activated (step S31), and an oscillator 51 in the electronic control unit 50 generates the AC signal Vs with a constant frequency (step S32).

(3) Step of Electrically Connecting the Entire Circuit in the Power Supply System Here, when the voltage Vd measured by a DC voltage measurement section 19 is lower than a threshold value of 10V (step S33), all the gates in the IGBT circuits 70-75 in the inverter circuit 12 are turned on (step S35). Accordingly, the AC high voltage circuit B and the DC high voltage circuit A are electrically connected.

(4) Step of Applying the AC Voltage Signal

Next, the AC signal Vs generated by the oscillator 51 is applied, through the resistance R and the capacitor C, to the applying point P on the positive line 13 (S36). It should be noted that the applying point P may be provided to the negative line 14. The applied AC signal Vs is also transmitted to the electrically connected AC high voltage circuit B.

(5) Step of Measuring the Voltage at the Voltage Measurement Point

The voltage measurement section 52 in the electronic control unit 50 measures the voltage level at the measurement point Q. The measurement of the voltage level is performed sequentially after the AC signal Vs is applied (step S36).

(6) Step of Detecting Whether or not the Leakage Exists

Finally, the leakage detection section 53 in the electronic control unit 50 compares the measurement result of the voltage measurement section 52 with the threshold value to detect whether or not the leakage exists (step S37).

In the leakage detection method above, all the gates in the IGBT circuits 70-75 are turned on. Thus, the AC signal Vs flows through the IGBT circuits 70-75 in the AC high voltage circuit B in both directions, and full waves of the AC signal Vs are transmitted to the AC lines 16a-16c. In other words, unlike the conventional art, it does not occur in the present invention that, although half wave of the AC signal Vs, i.e., the signal directing to one direction can be passed through each of the diodes 77 and be transmitted to the AC lines 16a-16c, the remaining half wave, i.e., a signal directing to the opposite direction is stopped at each of the diodes 77, and is blocked at each of the IGBT circuits 70-75.

As described above, according to the eighth aspect of the present invention, not only whether or not the leakage exists in the DC high voltage circuit, but also whether or not the leakage exists in the AC high voltage circuit can be correctly and easily detected.

In the ninth aspect of the present invention, the detection of whether or not the leakage exists in the power supply system in the eighth aspect of the present invention is performed at the time when operation for activating the vehicle is performed.

In FIGS. 1 and 3, if the leakage is not detected (step S37), a voltage adjusting process in which the capacitor 18 is charged with the battery 11 is performed as a pre-process for moving to the normal control (step S43). Then, a contactor control section 55 causes the contactor 17 to be turned on (step S44). Accordingly, the control of the switching elements in the electric power conversion circuit is moved to the normal control (normal control).

Therefore, the leakage can be detected without deteriorating the operation efficiency of the vehicle and efficiency of work made by the vehicle.

In the tenth aspect of the present invention, the detection whether or not the leakage exists in the power supply system in the eighth aspect of the present invention is performed at the time when operation for stopping the vehicle from working is performed.

In the configuration shown in FIG. 1 and a process procedure shown in FIG. 4, when the operator stops the vehicle from working by turning off the ignition, the contactor control section 55 in the electronic control unit 50 turns off the contactor 17 (step S50, step S51). Then, the DC voltage of the capacitor 18 is decreased (step S52, step S53). When the voltage Vd measured by the DC voltage measurement section 19 is lower than a threshold value of 10V, the switching element control section 54 in the electronic control unit 50 turns on all the gates in the IGBT circuits 70-75 in the inverter circuit 12 (Y in step S53, step S54). Accordingly, the AC high voltage circuit B and the DC high voltage circuit A are electrically connected.

Then, as is the case with the steps S37-S41 described in the eighth aspect of the present invention, the process of detecting whether or not the leakage exists, and the process of identifying where the leakage occurs are implemented (steps S57-S61).

Next, the contactor control section 55 turns off a relay 81 to electrically block the electronic control unit 50 from the electric power source, and then, the operation of the electronic control unit 50 is ended (step S62).

As described above, in the tenth aspect of the present invention, the vehicle is stopped from working after it is detected whether or not the leakage exists in the power supply system. Thus, the leakage can be detected without deteriorating the operation efficiency of the vehicle and the efficiency of the work made by the vehicle. Additionally, maintenance can be implemented while the vehicle is not in operation, whereby repairing operation can be completed by the time when the vehicle starts its next operation. Accordingly, the operation schedule is not delayed by the maintenance operation required by the leakage.

DETAILED DESCRIPTION OF THE INVENTION

Hereinbelow, exemplary embodiments of the present invention will be described with reference to drawings.

First Example

FIG. 1 is a diagram showing a configuration of a First Example. In FIG. 1, the leakage detection device of the vehicle-mounted power supply system comprises a power supply system 10 and a leakage detection section 30.

The power supply system 10 shown in FIG. 1 is basically the same as the power supply system as described using FIG. 6, except that the contactor 17b is not provided on the negative line 14 in FIG. 1. In the First Example, a contactor may be provided on the negative line 14. However, in doing so in the leakage detection device of the First Example, it is necessary that any one of the contactors provided on the positive line and the negative line be turned on while the other is turned off.

The power supply system 10 comprises a DC high voltage circuit A and an AC high voltage circuit B. The DC high voltage circuit A comprises a battery 11 for the direct current; a positive line 13 and a negative line 14 that are connected respectively to a positive side and a negative side of the battery 11; a contactor 17 that is provided on the positive line 13; a rush current prevention capacitor 18 that is located after the contactor 17 and is connected to the positive line 13 and the negative line 14, and that prevents rush current from flowing at the time of turning on the contactor 17; a DC voltage measurement section 19 that is connected in parallel with the capacitor 18; and a voltage decreasing circuit 25 that is connected in parallel with the capacitor 18 and decreases the DC voltage in the capacitor 18. The voltage decreasing circuit 25 comprises, for example, a resistance and a relay.

The AC high voltage circuit B comprises an inverter circuit 12 that is connected to the positive line 13 and the negative line 14 and converts the direct-current power to the alternating-current power by switching on/off plural switching elements, an AC motor 15, and plural AC lines 16 that connect the inverter 12 with the AC motor 15.

At the time of activating the AC motor 15, the contactor 17 is turned on. When the detection whether or the leakage exists is performed, the contactor 17 is turned off so as not to flow the short-circuit current in the inverter 12.

As shown in FIG. 7, the inverter circuit 12 is provided with six IGBT circuits 70-75 comprising six IGBT elements 76 and six diodes 77. When the AC motor is a three-phase motor, three sets of circuits, IGBT circuits 70, 73, IGBT circuits 71, 74 and IGBT circuits 72, 75, are connected in parallel.

An intermediate point M1 between the IGBT circuits 70, 73, an intermediate point M2 between the IGBT circuits 71, 74 and an intermediate point M3 between the IGBT circuits 72, 75 are connected respectively to three coils in the AC motor 15.

It should be noted that an SRM driver circuit, a voltage step-up chopper circuit or a voltage step-down chopper circuit may be employed in place of the inverter circuit 12.

The leakage detection section 30 comprises a capacitor C that is connected to a voltage applying point P on the positive line 13 located on the positive side of the battery 11; a resistance R that is connected to the capacitor C; an electronic control unit 50; an electric power source 60 for the electronic control unit; a switch 80 that is switched on/off in accordance with the operation of a ignition key of the vehicle and electrically connects/disconnects the electronic control unit 50 and the electric power source 60; and, a relay 81 of which turning on/off is controlled by the electronic control unit 50 and that electrically connects/disconnects the electronic control unit 50 and the electric power source 60.

FIG. 2 is a diagram showing a configuration of the electronic control unit 50 using a function block.

The electronic control unit 50 comprises an oscillator 51 that generates an AC signal Vs with a prescribed frequency, such as a sine wave or a square wave, and provides the AC signal Vs to the resistance R; a voltage measurement section 52 (i.e., a voltage measurement means) that measures a voltage level (effective value of the AC voltage) at a voltage measurement point Q located between the resistance R and the capacitor C; a leakage detection section 53 (i.e., a leakage detection means) that detects whether or not the leakage exists by comparing the voltage measured by the voltage measurement section 52 with a preset threshold value; a switching element control section 54 that controls to turn on/off each of the IGBT elements (switching elements) 76 provided to the IGBT inverter circuit 12; and a contactor control section 55 that controls to turn on/off the contactor 17 and the relay 81. Function of each of the sections 51-55 in the electronic control unit 50 is implemented by an electronic circuit or a program.

Next, a process procedure of the leakage detection in the First Example will be described with reference to FIG. 3.

Before the operation of the ignition key, the contactor 17 is in a state of being turned off.

After an operator turns on the ignition key to activate the vehicle, the switch 80, accordingly, is turned on. When the ignition key is turned on, the contactor 17 maintains the state of being turned off (step S30). Upon turning on the switch 80, the voltage from the electric power source 60 is applied to the electronic control unit 50, and the electronic control unit 50 is activated (step S31).

Next, the contactor control section 55 in the electronic control unit 50 turns on the relay 81. Additionally, the oscillator 51 generates the AC signal Vs with a constant frequency (step S32).

The DC voltage measurement section 19 measures the voltage Vd at the capacitor 18 (step S33). It should be noted that the DC voltage measurement section 19 is also controlled by the voltage control unit 50. When the voltage Vd measured by the DC voltage measurement section 19 is a threshold value of 10V or over, the voltage decreasing circuit 25 is activated to decrease the DC voltage at the capacitor 18. It should be noted that the voltage decreasing circuit 25 is also controlled by the voltage control unit 50 (N in step S33, step S34). The DC voltage decreasing is a process in which the relay in the voltage decreasing circuit 25 is turned on; accumulated energy at the capacitor 18 is consumed at a resistance in the voltage decreasing circuit; and the voltage at the capacitor 18 is lowered to less than a prescribed level (10V). The process of decreasing the DC voltage continues until the voltage Vd measured by the DC current voltage is decreased to less than the threshold value of 10V.

If the voltage Vd measured by the DC voltage measurement section 19 is less than the threshold value of 10V, the switching element control section 54 in the electronic control unit 50 turns on all the gates in the IGBT circuits 70-75 in the inverter circuit 12 (Y in step S33, step S35). In other words, in a state where the contactor 17 remains turned off, all the IGBT elements (switching elements) 76 in the IGBT inverter circuit 12 are turned on. Accordingly, the AC high voltage circuit B and the DC high voltage circuit A is electrically connected.

The AC signal Vs generated by the oscillator 51 is applied, through the resistance R and the capacitor C, to the applying point P (step S36). The voltage measurement section 53 detects whether or not the leakage exists by comparing the measured result by the voltage measurement section 52 with the threshold value (step S37).

Since all the gates in the IGBT circuits 70-75 are turned on, the AC signal Vs flows through the IGBT circuits 70-75 in the AC high voltage circuit B in both directions, whereby full waves of the AC signal Vs are transmitted to the AC lines 16*a*-16*c*. In other words, unlike the conventional art, it does not occur in the present invention that, although half wave of the AC signal Vs, i.e., the signal directing to one direction can be passed through each of the diodes 77 and be transmitted to the AC lines 16*a*-16*c*, the remaining half wave, i.e., a signal directing to the opposite direction is stopped at each of the diodes 77, and is blocked at each of the IGBT circuits 70-75.

If the leakage (leakage resistance r) does not occur in the DC high voltage circuit A, the effective value of voltage measured by the voltage measurement section 52 is substantially the same as the effective value of voltage of the AC signal Vs outputted from the oscillator 51. Thus, it is determined that the measured value is the set threshold value or over. Accordingly, it is determined that the leakage does not exists.

On the other hand, if the leakage exists in the DC high voltage circuit A, for example, if the leakage (leakage resistance r) exists in the negative line 14, the effective value of voltage of the AC signal Vs is divided to the resistance R and the leakage resistance r. Thus, the effective value of voltage measured by the voltage measurement section 52 is smaller than the effective value of voltage of the AC signal Vs outputted from the oscillator 51, and it is determined by the leakage detection section 53 that the measured voltage is lower than the set threshold value. Accordingly, it is determined that the leakage exists.

If the leakage (leakage resistance r) does not occur in the AC high voltage circuit B, the AC signal Vs flows through the IGBT circuits 70-75 in the AC high voltage circuit B in both directions, and full waves of the AC signal Vs are transmitted to the AC lines 16*a*-16*c*. Thus, the effective value of voltage measured by the voltage measurement section 52 is substantially the same as the effective value of voltage of the AC signal Vs outputted from the oscillator 51, and it is determined that the measured value is the set threshold value or over. Accordingly, it is determined that the leakage does not exists.

On the other hand, if the leakage exists in the AC high voltage circuit B, for example, if the leakage (leakage resistance r) exists in the AC lines 16*a*-16*c*, the effective value of voltage of the AC signal Vs is divided to the resistance R and the leakage resistance r. Thus, the effective value of voltage measured by the voltage measurement section 52 is smaller than the effective value of voltage of the AC signal outputted from the oscillator 51, and it is determined by the leakage detection section 53 that the measured voltage is lower than the set threshold value. Accordingly, it is determined that the leakage exists.

As described above, not only whether or not the leakage exists in the DC high voltage circuit A, but also whether or not the leakage exists in the AC high voltage circuit B can be correctly detected.

If the leakage is not detected (N in step S37), a pre-process is implemented to move to the normal control. Firstly, to prevent high current from flowing in the inverter circuit 12, a process of adjusting the voltage charged from the battery to the capacitor 18 is implemented (step S43), and the contactor control section 55 turns on the contactor 17 (step S44). Through this process, for example, a switching signal in accordance with operation of an operation lever is applied to each of the IGBT elements (switching elements) 76 in the IGBT inverter circuit, and the AC motor 15 is driven in accordance with the operation of the operation lever (normal control).

On the other hand, if the leakage is detected (Y in step S37), a process of determining the location where the leakage occurs is implemented as follows.

The switching element control section 54 turns off all the gates in the IGBT circuit 70-75 in the inverter circuit 12 (step S38). Accordingly, the AC high voltage circuit B and the DC high voltage circuit A are electrically shut off.

Next, the oscillator 51 applies again the AC voltage Vs to the applying point P; the voltage measurement section 52 measures the voltage level at the measurement point Q; and, the leakage detection section 53 compares the voltage measured by the voltage measurement section 52 with the threshold value to detect whether or not the leakage exists (step S39).

As a result, if the leakage is not detected, "leakage is detected" in a state where the AC high voltage circuit B and the DC high voltage circuit A are electrically connected, while "leakage is not detected" in a state where the AC high voltage circuit B and the DC high voltage circuit A are electrically shut off. Thus, it is determined that the leakage detected in step 37 occurs on the side of the AC high voltage circuit B (N in step 39, step S40).

On the other hand, if the leakage is detected, "leakage is detected" in a state where the AC high voltage circuit B and the DC high voltage circuit A are electrically connected, while "leakage is detected" in a state where the AC high voltage circuit B and the DC high voltage circuit A are electrically shut off. Thus, it is determined that the leakage detected in step 37 occurs on the side of the DC high voltage circuit A (Y in step 39, step S41).

It should be noted that whether or not the leakage exists or where the leakage occurs may be displayed in a display device, which is not shown. Through this display, the operator can immediately perform the maintenance of the leaked location.

According to the First Example, not only whether or not the leakage exists in the DC high voltage circuit A, but also whether or not the leakage exists in the AC high voltage circuit B can be detected. Furthermore, according to the First Example, it can be identified which side of the DC high voltage circuit A or the AC high voltage circuit B the leakage occurs. Thus, the maintenance of the location of the leakage can be immediately performed, whereby the operation efficiency can be improved.

Additionally, according to the First Example, the leakage detection is performed at the time of activating the vehicle. As a result, the leakage can be detected without deteriorating operation efficiency of the vehicle and efficiency of work made by the vehicle.

Moreover, according to the First Example, only if the leakage is not detected, control is moved to the normal control and the vehicle is made in full operation. As a result, a case where the vehicle is operated while the leakage occurs can be avoided, whereby safety can be ensured.

It should be noted that, in the example, the contactor 17 is provided to the positive line 13. However, the contactor 17 may be provided to the negative line 14.

Additionally, in the example, the voltage applying point P to which the AC voltage Vs is applied is located on the positive line 13. However, the voltage applying point P may be located on the negative line 14.

Second Example

In a Second Example, in response to operation for stopping the vehicle from working, it is detected whether or not the leakage exists.

FIG. 4 is a flow chart showing a procedure of leakage detection process in the Second Example. The contactor 17 is turned on before the ignition key is turned off When the operator stops the vehicle from working by turning off the ignition key, the switch 80 is caused to be turned off while the contactor control section 55 in the electronic control unit 50 turns off the contactor 17 (step S50, step S 51). Next, a process of decreasing the DC voltage at the capacitor 18 is implemented until the voltage Vd measured by the DC voltage measurement section 19 is decreased to less than the threshold value of 10V (step S52, step S53).

When the voltage Vd measured by the DC voltage measurement section 19 is less than the threshold value of 10V, the switching element control section 54 in the electronic control unit 50 turns off all the gates in the IGBT circuits 70-75 in the IGBT inverter circuit 12 (Y in step S53, step S54). In other words, in a state where the contactor 17 is turned off, all the IGBT elements (switching elements) 76 in the IGBT inverter circuit 12 are turned on. Accordingly, the AC high voltage circuit B and the DC high voltage circuit A are electrically connected.

The oscillator 51 generates the AC signal Vs with a prescribed frequency (step S55). This AC signal Vs is applied, through the resistance R and the capacitor C, to the applying point P on the positive line 13 in the power supply system 10 (step S56).

Next, as is the case with S37, S38, S39, S40 and S41 shown in FIG. 3, a process of detecting whether or not the leakage exists, and a process of identifying the location of the leakage are implemented (S57, S58, S59, S60, S61).

In other words, the voltage measurement section 52 measures the voltage level at the measurement point Q. The leakage detection section 53 compares the measured result by the voltage measurement section 52 with the threshold value to detect whether or not the leakage exists (step S57).

Since all the gates in the IGBT circuits 70-75 are turned on, the AC signal Vs flows through the IGBT circuits 70-75 in the AC high voltage circuit B in both directions, and full waves of the AC signal Vs are transmitted to the AC lines 16a-16c. In other words, unlike the conventional art, it does not occur in the present invention that, although half wave of the AC signal Vs, i.e., the signal directing to one direction can be passed through each of the diodes 77 and be transmitted to the AC lines 16a-16c, the remaining half wave, i.e., a signal directing to the opposite direction is stopped at each of the diodes 77, and is blocked at each of the IGBT circuits 70-75.

If the leakage (leakage resistance r) does not occur in the DC high voltage circuit A, the effective value of voltage measured by the voltage measurement section 52 is substantially the same as the effective value of voltage of the AC signal Vs outputted from the oscillator 51, and it is determined that the measured voltage is the set threshold value or over. Accordingly, it is determined that the leakage does not exist.

On the other hand, if the leakage exists in the DC high voltage circuit A, for example, if the leakage (leakage resistance r) exists in the negative line 14, the effective value of voltage of the AC signal Vs is divided to the resistance R and the leakage resistance r. Thus, the effective value of voltage of the AC signal Vs is smaller than the effective value of voltage of the AC signal Vs outputted from the oscillator 51, and the leakage detection section 53 determines that the measured voltage is smaller than the set threshold value. Accordingly, it is determined that the leakage exists.

If the leakage (leakage resistance r) does not occur in the AC high voltage circuit, the AC signal Vs flows through the IGBT circuits 70-75 in the AC high voltage circuit B in both directions, and full waves of the AC signal Vs can be transmitted to the AC lines 16*a*-16*c*. Thus, the effective value of voltage measured by the voltage measurement section 52 is substantially the same as the effective value of voltage of the AC signal Vs outputted from the oscillator 51, and the leakage detection section 53 determines that the measured voltage is the set threshold value or over. Accordingly, it is determined that the leakage does not exist.

On the other hand, if the leakage exists in the AC high voltage circuit B, for example, if the leakage (leakage resistance r) exists in the AC lines 16*a*-16*c*, the effective value of voltage of the AC signal Vs is divided to the resistance R and the leakage resistance r. Thus, the effective value of voltage measured by the voltage measurement section 52 is smaller than the effective value of voltage of the AC signal Vs outputted from the oscillator 51, and the leakage detection section 53 determines that the measured voltage is smaller than the set threshold value. Accordingly, it is determined that the leakage exists.

As described above, not only the existence/absence of the leakage in the DC high voltage circuit A, but also the existence/absence of the leakage in the AC high voltage circuit B can be correctly detected.

If the leakage is detected (Y in step S57), a process of determining where the leakage occurs is implemented as follows.

The switching element control section 54 turns off all the gates in the IGBT circuits 70-75 in the inverter circuit 12 (step S58). Accordingly, the AC high voltage circuit B and the DC high voltage circuit A are electrically shut off.

Next, the oscillator 51 applies again the AC voltage Vs to the applying point P; the voltage measurement section 52 measures the voltage level at the measurement point Q; and, the leakage detection section 53 compares the voltage measured by the voltage measurement section 52 with the threshold value to detect whether or not the leakage exists (step S59).

As a result, if the leakage is not detected, "leakage is detected" in a state where the AC high voltage circuit B and the DC high voltage circuit A are electrically connected, while "leakage is not detected" in a state where the AC high voltage circuit B and the DC high voltage circuit A are electrically shut off. Thus, it is determined that the leakage detected in step S57 occurs on the side of the AC high voltage circuit B (N in step S59, step S60).

On the other hand, if the leakage is detected, "leakage is detected" in a state where the AC high voltage circuit B and the DC high voltage circuit A are electrically connected, while "leakage is detected" in a state where the AC high voltage circuit B and the DC high voltage circuit A are electrically shut off. Thus, it is determined that the leakage detected in step S57 occurs on the side of the DC high voltage circuit A (Y in step S59, step S61).

If the leakage is not detected in S57 (N in step S57), or if the leakage is detected in S57 and the location of the leakage is identified (step S60, S61), the contactor control section 55 turns off the relay 81 to electrically block the power source 60 from the electronic control unit 50. Then, the operation of the electronic control unit 50 is ended (step S62).

It should be noted that whether or not the leakage exists or where the leakage occurs may be displayed in a display device, which is not shown. Through this display, the operator can immediately perform the maintenance of the leaked location.

According to the Second Example, not only whether or not the leakage exists in the DC high voltage circuit A, but also whether or not the leakage exists in the AC high voltage circuit B can be detected. Furthermore, according to the Second Example, it can be identified which side of the DC high voltage circuit A or the AC high voltage circuit B the leakage occurs. Thus, the maintenance of the location of the leakage can be immediately performed, whereby the operation efficiency can be improved.

Additionally, according to the Second Example, the leakage is detected at the time of stopping the vehicle from working, and the operation of the electronic control unit 50 is ended after the confirmation of whether or not the leakage exists. As a result, the leakage can be detected without deteriorating operation efficiency of the vehicle and efficiency of work made by the vehicle. Additionally, maintenance can be implemented while the vehicle is not in operation, whereby repairing operation can be completed by the time when the vehicle starts its next operation. Accordingly, the operation schedule is not delayed by the maintenance operation required by the leakage.

In the First Example and Second Example described above, in a state where the contactor 17 is turned on, all the IGBT elements (switching elements) 76 in the IGBT inverter circuit 12 are turned on, and it is detected whether the leakage occurs. As a result, if the leakage is detected, all the IGBT elements (switching elements) 76 in the IGBT inverter circuit 12 are turned off, and it is detected whether or not the leakage exists. As a result, if the leakage is detected, it is determined that the leakage occurs before the inverter circuit 12, i.e., on the side of the DC high voltage circuit A. On the other hand, if the leakage is not detected, it is determined that the leakage occurs in the inverter circuit 12 or after, i.e., on the side of the AC high voltage circuit B.

However, to identify where the leakage occurs, the sequence of turning on/off the IGBT elements (switching elements) 76 can be reversed.

Specifically, it may be possible to employ a configuration in which all the IGBT elements (switching element) 76 in the IGBT inverter circuit 12 are turned off and whether or not the leakage exists is detected in a state where the contactor 17 is turned off; as a result, if the leakage is detected, all the IGBT elements (switching elements) 76 in the IGBT inverter circuit 12 are turned on, and whether or not the leakage exists is detected; as a result, if the leakage is detected, it is determined that the leakage occurs before the inverter circuit 12, i.e., on the side of the DC high voltage circuit A; and, on the other hand, if the leakage is not detected, it is determined that the leakage occurs in the inverter circuit 12 or after, i.e., on the side of the AC high voltage circuit B.

It should be noted that, in the example, the contactor 17 is provided to the positive line 13. However, the contactor 17 may be provided to the negative line 14.

Additionally, in the example, the voltage applying point P to which the AC voltage Vs is applied is located on the positive line 13. However, the voltage applying point P may be located on the negative line 14.

Third Example

In the First Example and Second Example, it is assumed that the leakage is detected at the time of activating the vehicle or of stopping the vehicle from working. A Third Example will be described by assuming a case where the leakage detection is performed while the vehicle is being in operation.

FIG. 5 is a flow chart showing a process procedure of the Third Example.

During the normal control, for example, switching signal in accordance with the operation of the operation lever is applied to each of the IGBT elements (switching elements) 76 in the IGBT inverter circuit 12, and the AC motor 15 is driven in accordance with the operation of the operation lever (normal control).

When a signal for instructing the detection of the leakage is inputted, the switching signal for causing the AC motor 15 to be in a stopped status is automatically applied to each of the IGBT elements (switching elements) 76 regardless of the operation status of the operation lever. Additionally, it may be possible that the switching signal for causing the AC motor 15 to be in a stopped status is applied to each of the IGBT elements (switching elements) 76 (step S70) by placing the operation lever to the neutral position through the manual operation by the operator.

Next, in a state where the contactor 17 is turned on, the switching element control section 54 in the electronic control unit 50 turns on the gates in all the IGBT circuits 70-72 on the positive side (all the IGBT elements (switching elements) 76 in upper part of FIG. 7) among the IGBT circuits 70-75 in the inverter circuit 12 while turning off the gates (all the IGBT elements (switching elements) 76 in upper part of FIG. 7) in all the IGBT circuit 73-75 on the negative side. Or, the switching element control section 54 turns on gates in all the IGBT circuits 73-75 on the negative side while turning off the gates in all the IGBT circuits 70-72 on the positive side (step S71).

In other words, in a state where the contactor 17 is turned on, by turning on all the IGBT elements (switching elements) 76 on the positive side in the IGBT inverter 12 or by turning on all the IGBT elements (switching elements) 76 on the negative side in the IGBT inverter 12, the AC high voltage circuit B and the DC high voltage circuit A are electrically connected.

It should be noted that, since either of the IGBT elements (switching elements) 76 on the positive side in the IGBT inverter 12 or the IGBT elements (switching elements) 76 on the negative side in the IGBT inverter 12 is energized, the contactor 17 is turned on. Additionally, since the IGBT elements (switching elements) 76 on the positive side in the IGBT inverter 12 and that in the negative side in the IGBT inverter 12 are not turned on at the same time, the short circuit current does not flow in the inverter circuit 12 even if the contactor 17 is turned on.

The oscillator 51 generates the AC signal Vs with a prescribed frequency (step S72). The AC signal Vs is applied, through the resistance R and the capacitor C, to the applying point P on the positive line 13 in the power supply system 10 (step S73).

Next, as is the case with S37, S38, S39, S40 and S41 shown in FIG. 3, a process of detecting whether or not the leakage exists, and a process of identifying the location of the leakage are implemented (S74, S75, S76, S77, S78).

In other words, the voltage measurement section 52 measures the voltage level at the measurement point Q. The leakage detection section 53 compares the measured result by the voltage measurement section 52 with the threshold value to detect whether the leakage exists (step S74).

Since the gates on either of the positive side or the negative side of the IGBT circuits 70-75 are turned on, the AC signal Vs flows, in both direction, through the IGBT circuits on the side which is turned on in the AC high voltage circuit B, and full waves of the AC signal Vs are transmitted to the AC lines 16a-16c. In other words, unlike the conventional art, it does not occur in the present invention that, although half wave of the AC signal Vs, i.e., the signal directing to one direction can be passed through each of the diodes 77 and be transmitted to the AC lines 16a-16c, the remaining half wave, i.e., a signal directing to the opposite direction is stopped at each of the diodes 77, and is blocked at each of the IGBT circuits 70-75.

If the leakage (leakage resistance r) does not occur in the DC high voltage circuit A, the effective value of voltage measured by the voltage measurement section 52 is substantially the same as the effective value of voltage of the AC signal Vs outputted from the oscillator 51. Thus, the leakage detection section 53 determines that the measured voltage is the set threshold value or over. Accordingly, it is detected that the leakage does not exist.

On the other hand, if the leakage exists in the DC high voltage circuit A, for example, if the leakage (leakage resistance r) exists in the negative line 14, the effective value of voltage of the AC signal Vs is divided to the resistance R and the leakage resistance r. Thus, the effective value of voltage measured by the voltage measurement section 52 is smaller than the effective value of voltage of the AC signal Vs outputted from the oscillator 51. Thus, the leakage detection section 53 determines that the measured voltage is smaller than the set threshold value. Accordingly, it is determined that the leakage exists.

If the leakage (leakage resistance r) does not occur in the AC high voltage circuit B, the AC signal Vs flows through the IGBT circuits 70-75 in the AC high voltage circuit B in both directions, and full waves of the AC signal Vs are transmitted to the AC lines 16a-16c. Thus, the effective value of voltage measured by the voltage measurement section 52 is substantially the same as the effective value of voltage of the AC signal Vs outputted from the oscillator 51. Thus, the leakage detection section 53 determines that the measured value is the set threshold value or over. Accordingly, it is determined that the leakage does not exist.

On the other hand, if the leakage exists in the AC high voltage circuit B, for example, if the leakage (leakage resistance r) exists in the AC lines 16a-16c, the effective value of voltage of the AC signal Vs is divided to the resistance R and the leakage resistance r. Thus, the effective value of voltage measured by the voltage measurement section 52 is smaller than the effective value of voltage of the AC signal Vs outputted from the oscillator 51. Thus, the leakage detection section determines that the measured value is smaller than the set threshold value. Accordingly, it is determined that the leakage exists.

As described above, not only whether or not the leakage exists in the DC high voltage circuit A, but also whether or not the leakage exists in the AC high voltage circuit B can be correctly detected.

If the leakage is detected (Y in step S74), a process of determining where the leakage occurs is implemented as follows.

The switching elements control section 54 turns off all the gates in the IGBT circuits 70-75 in the inverter circuit 12 (step S75). Accordingly, the AC high voltage circuit B and the DC high voltage circuit A are electrically shut off.

Next, the oscillator 51 applies again the AC voltage Vs to the applying point P; the voltage measurement section 52 measures the voltage level at the measurement point Q; and, the leakage detection section 53 compares the voltage measured by the voltage measurement section 52 with the threshold value to detect whether or not the leakage exists (step S76).

As a result, if the leakage is not detected, "leakage is detected" in a state where the AC high voltage circuit B and the DC high voltage circuit A are electrically connected, while "leakage is not detected" in a state where the AC high voltage circuit B and the DC high voltage circuit A are electrically shut off. Thus, it is determined that the leakage detected in step S74 occurs on the side of the AC high voltage circuit B (N in step S76, step S78).

On the other hand, if the leakage is detected, "leakage is detected" in a state where the AC high voltage circuit B and the DC high voltage circuit A are electrically connected, while "leakage is detected" in a state where the AC high voltage circuit B and the DC high voltage circuit A are electrically shut off. Thus, it is detected that the leakage detected in step S74 occurs on the side of the DC high voltage circuit A (Y in step S76, step S78).

If the leakage is not detected in S74 (N in step S57), control is moved to the normal control; the switching signal in accordance with the operation of the operation lever is applied to each of the IGBT elements (switching elements) 76 in the IGBT inverter circuit 12; and, the AC motor 15 is driven in accordance with the operation of the operation lever (S79; normal control).

It should be noted that whether or not the leakage exists or where the leakage occurs may be displayed in a display device, which is not shown. Through this display, the operator can immediately perform the maintenance of the leaked location.

According to the Third Example, not only whether or not the leakage exists in the DC high voltage circuit A, but also whether or not the leakage exists in the AC high voltage circuit B can be detected. Furthermore, according to the Third Example, it can be identified which side of the DC high voltage circuit A or the AC high voltage circuit B the leakage occurs. Thus, the maintenance of the location of the leakage can be immediately performed, whereby the operation efficiency can be improved.

Additionally, according to the Third Example, the leakage is detected during which the vehicle is in operation, and control is moved back to the normal control if the leakage does not exists. Thus, a case where the control is returned to the normal operation in a state where the leakage exists can be avoided, and safety can be ensured.

In the Third Example described above, in a state where the contactor 17 is turned on, all the IGTB elements (switching elements) 76 on the positive side of the IGBT inverter circuit 12 are turned on, or all the IGTB elements (switching elements) 76 on the negative side of the IGBT inverter circuit 12 are turned on, and it is detected whether or not the leakage exists. As a result, if the leakage is detected, all the IGBT elements (switching elements) 76 in the IGBT inverter 12 are turned off, and it is detected whether the leakage exists. As a result, if the leakage exists, it is determined that the leakage occurs before the inverter circuit 12, i.e., on the side of the DC high voltage circuit A. On the other hand, if the leakage is not detected, it is determined that the leakage occurs in the inverter circuit 12 or after, i.e., on the side of the AC high voltage circuit B.

It should be noted that, in the example, the contactor 17 is provided to the positive line 13. However, the contactor 17 may be provided to the negative line 14. Additionally, in a case when the AC motor 15 connected to the IGBT inverter circuit 12 shown in FIG. 7 is in the form of the delta connection or the Y (star) connection, either of the positive-side IGBT elements 76 or the negative-side IGBT elements 76 in any one of the phases are turned on. In the AC motor with the Y connection shown in FIG. 8, for example, if the leakage (leakage resistance r) occurs in the vicinity of the W phase, the leakage in the W phase can be detected by turning on either of the positive-side IGBT elements 76 or the negative-side IGBT elements 76 corresponding to the U phase, and by passing the AC signal to the U phase.

Additionally, in the example, the voltage applying point P to which the AC voltage Vs is applied is located on the positive line 13. However, the voltage applying point P may be located on the negative line 14.

Figure 1:
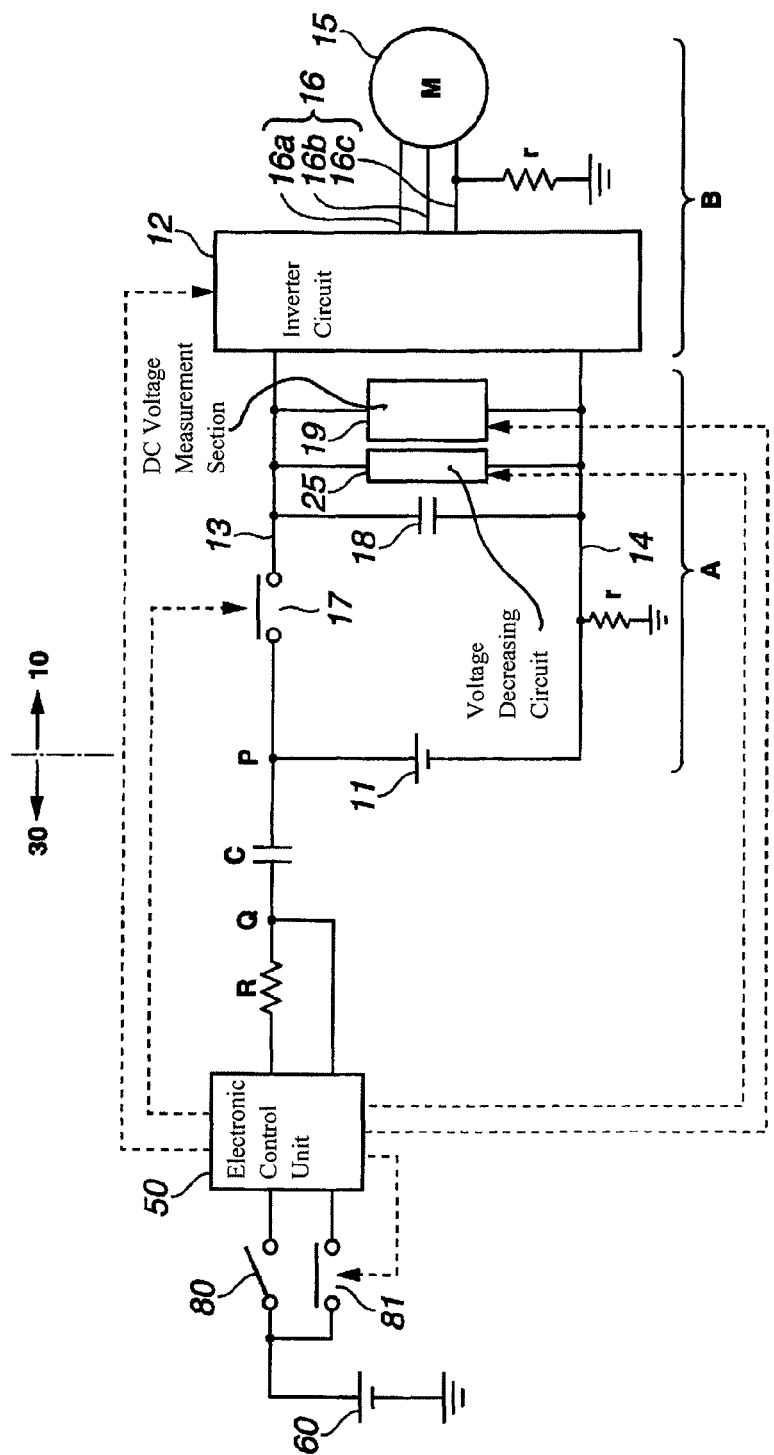
FIG. 1 is a diagram showing a configuration of a leakage detection device of a vehicle-mounted power supply system according to the First Example.
Figure 2:
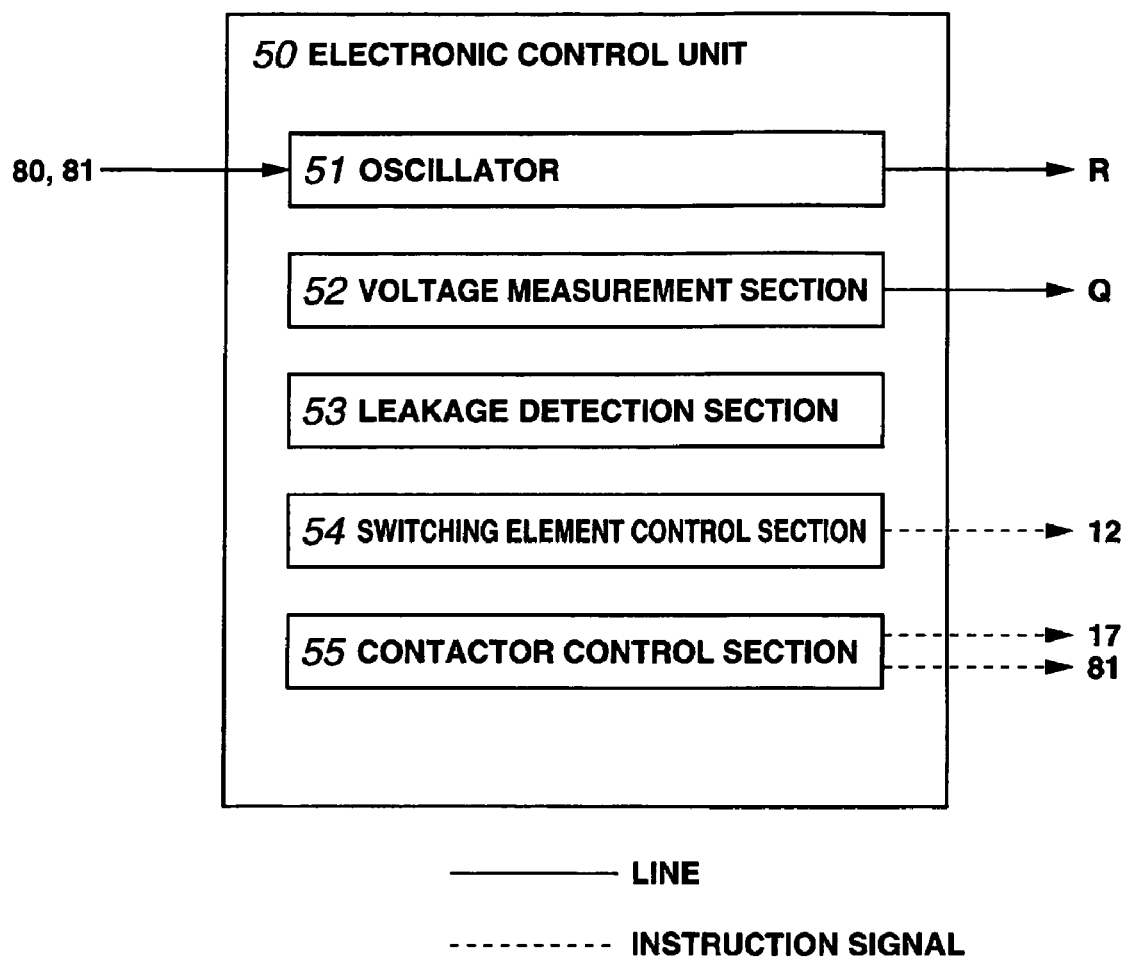
FIG. 2 is a diagram showing a configuration of an electronic control unit using functional blocks.
Figure 3:
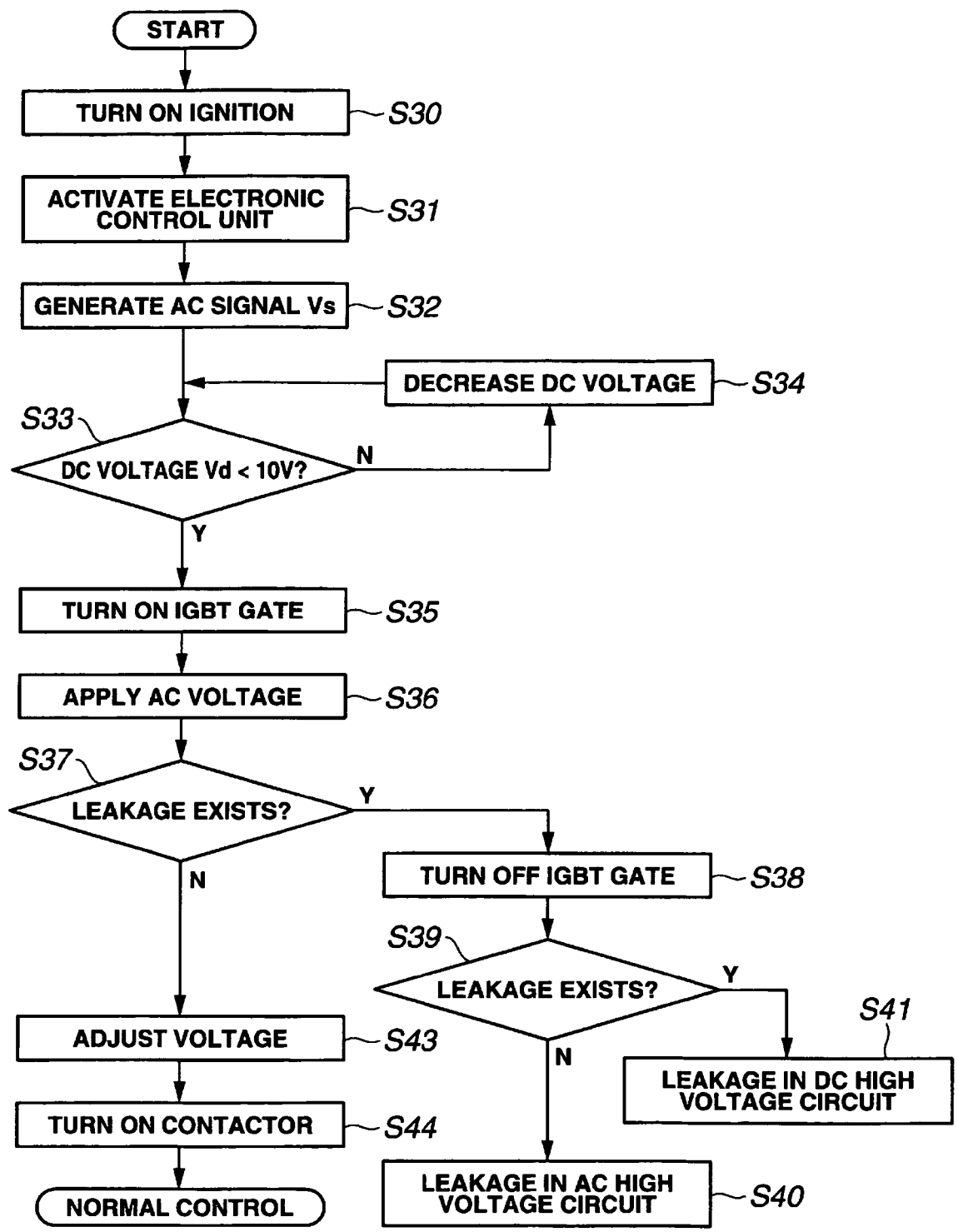
FIG. 3 is a flow chart showing a process procedure for detecting the leakage according to the First Example.
Figure 4:
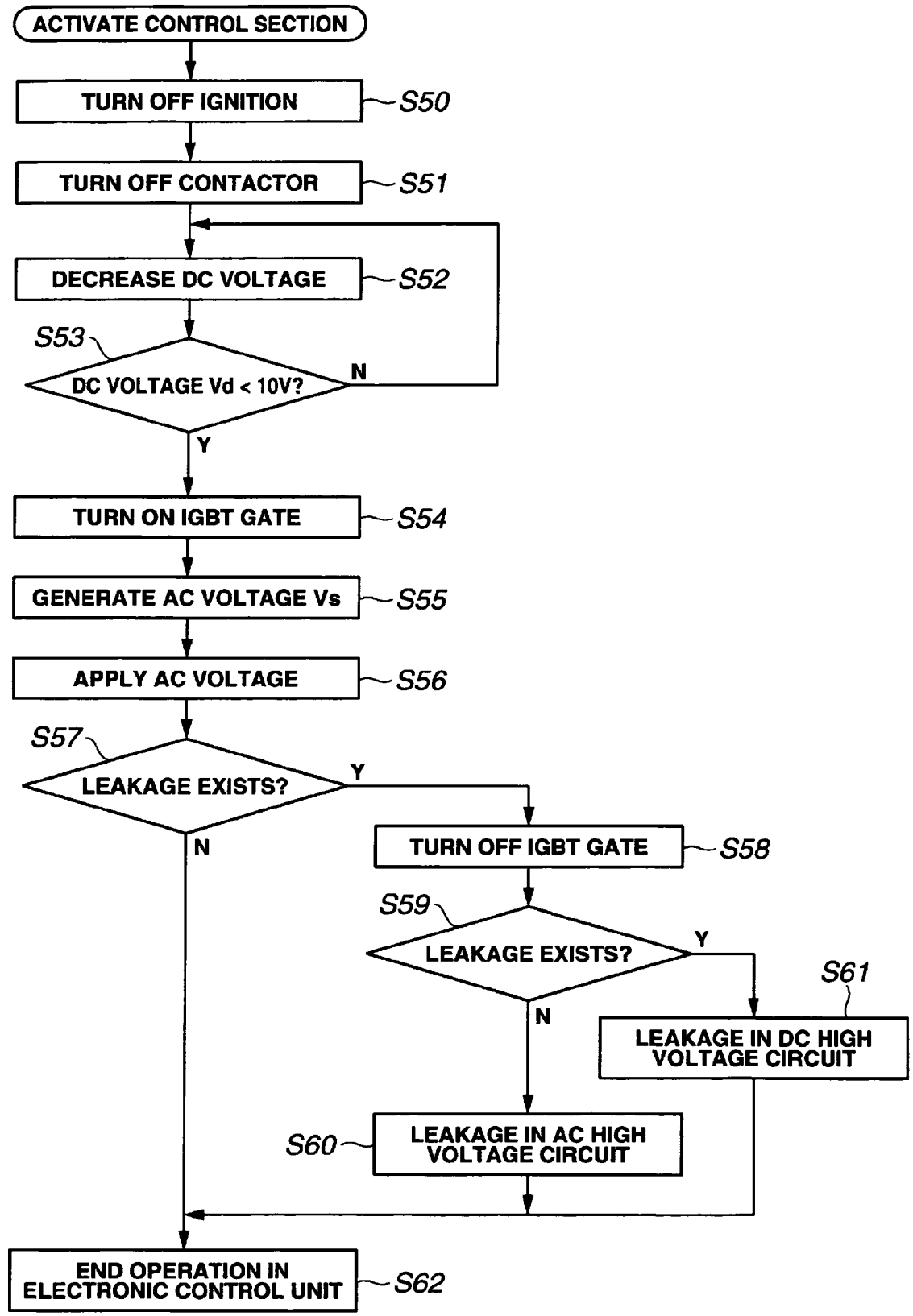
FIG. 4 is a flow chart showing a process procedure for detecting the leakage according to the Second Example.
Figure 5:
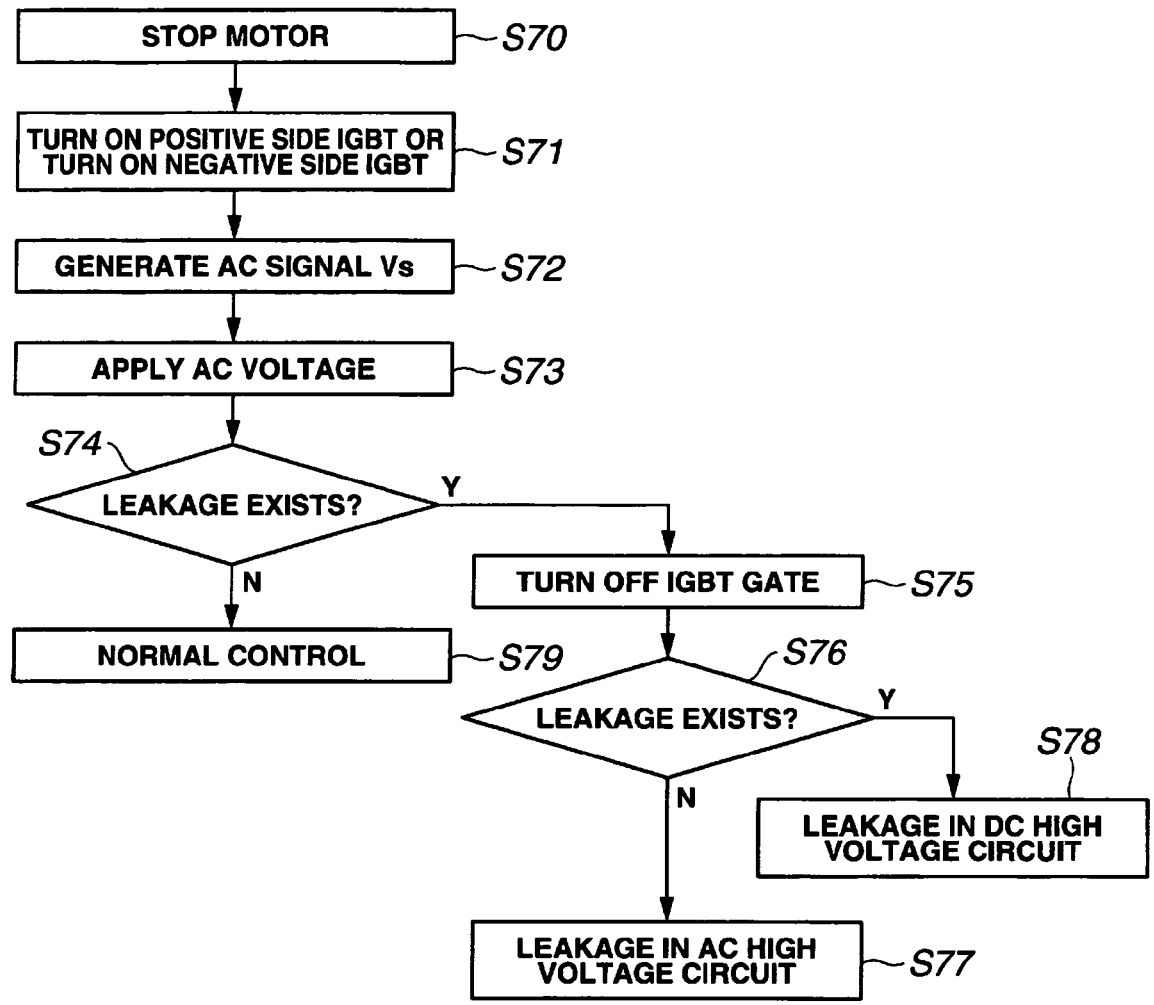
FIG. 5 is a flow chart showing a process procedure for detecting the leakage according to the Third Example.
Figure 6:
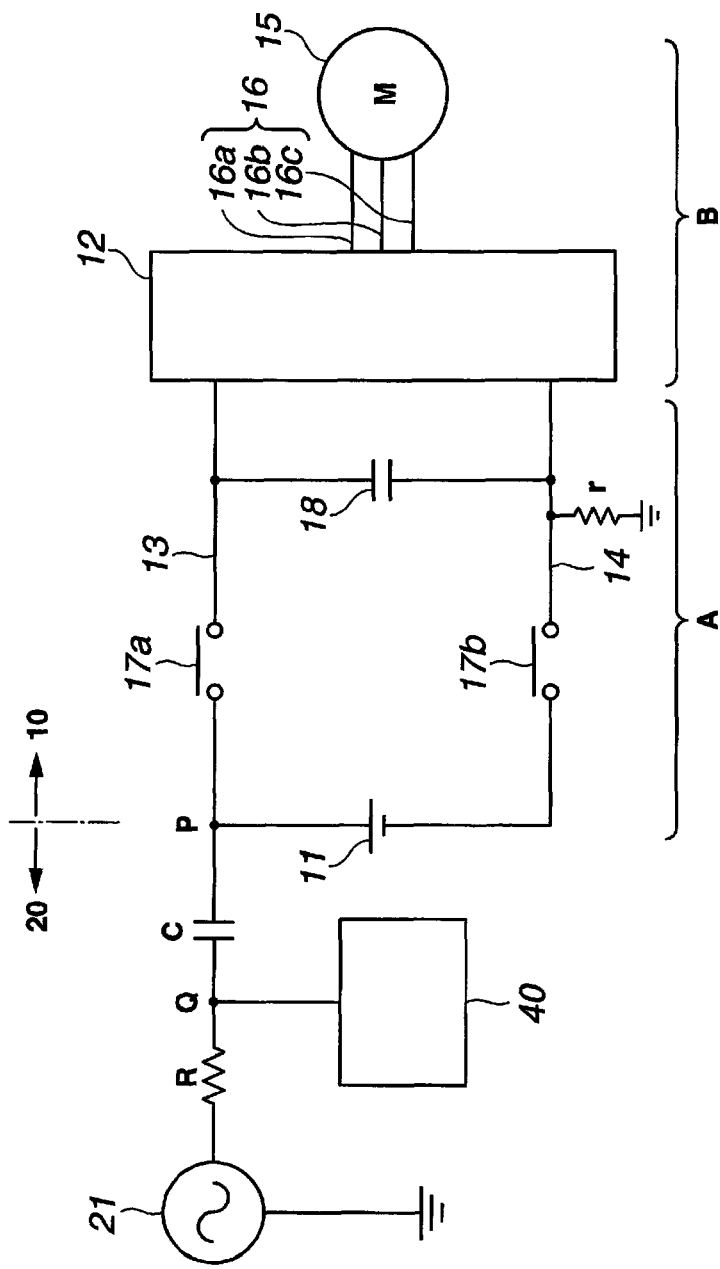
FIG. 6 is a diagram showing a conventional leakage detection device of a vehicle-mounted power supply system.
Figure 7:
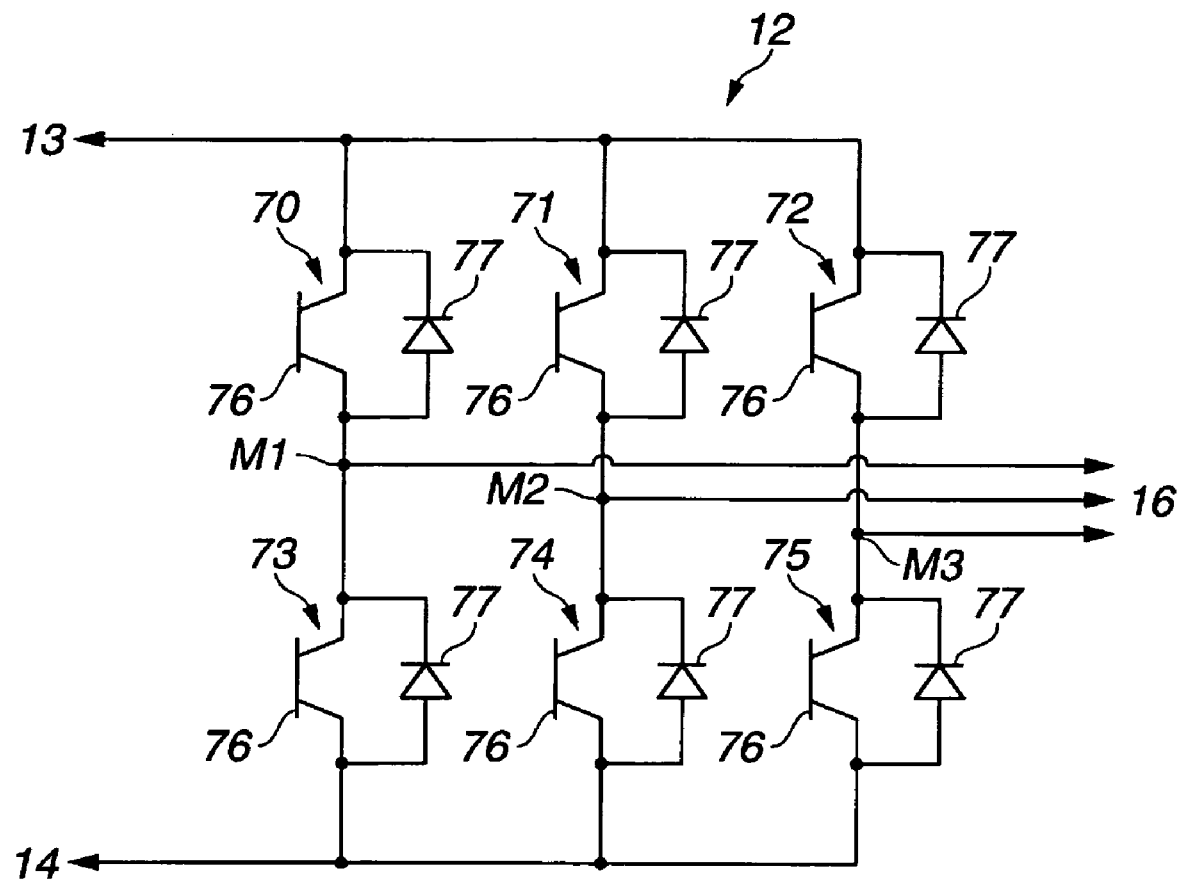
FIG. 7 is a diagram showing an IGBT inverter circuit.
Figure 8:
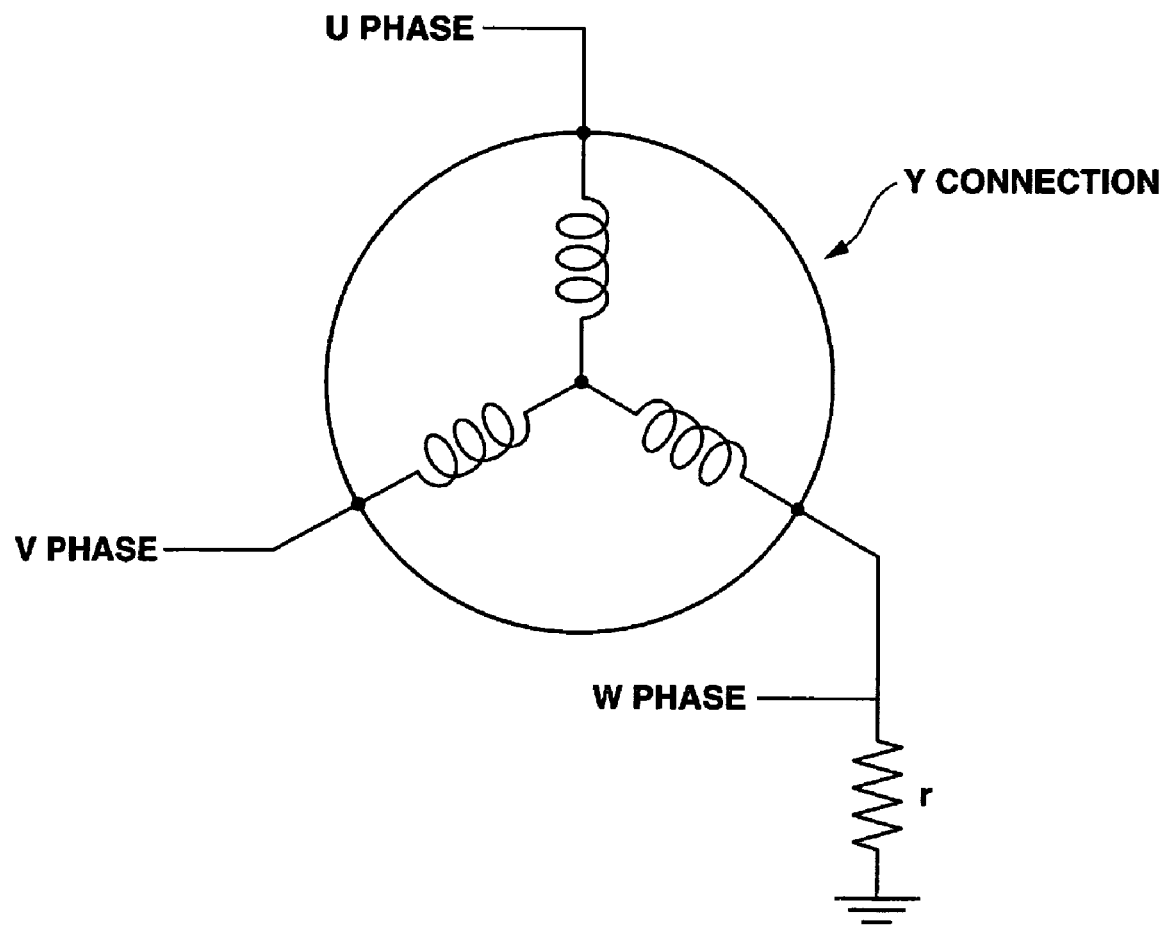
FIG. 8 is a diagram for explaining the leakage detection in an AC motor with a Y connection.

The invention claimed is:

1. A leakage detection device of a vehicle-mounted power supply system, in which a leakage in the power supply system is detected by a leakage detection section,
the power supply system comprising:
a battery for a direct current;
an electric power conversion circuit that converts a direct current power of the battery to an alternating current power by turning on/off a plurality of switching elements, and outputs the converted alternating current power to an AC motor;
a positive line and a negative line that connect the battery and the electric power conversion circuit; and
a contactor that is provided on the positive line or the negative line,
wherein the leakage detection section comprises:
a switching element control section that outputs a switching signal for detecting the leakage to the switching elements in the electric power conversion circuit;
AC voltage applying means that applies an AC voltage to a voltage applying point on the positive line or the negative line in the power supply system;
voltage measurement means that measures a voltage at a voltage measurement point located between the AC voltage and the voltage applying point; and
leakage detection means that turns on all of the switching elements in the electric power conversion circuit while the contactor is turned off, and detects whether or not the leakage exists in the power supply system on the basis of a voltage value at the voltage measurement point with all of the switching elements being turned on and the contactor being turned off.

2. The leakage detection device of a vehicle-mounted power supply system according to claim 1, wherein,
when an operation for activating a vehicle is performed, all the switching elements in the power conversion circuit are turned on while the contactor is turned off;
it is detected whether or not the leakage exists in the power supply system; and,
after it is detected whether or not the leakage exists in the power supply system, the contactor is turned on, and a control of the switching elements in the electric power conversion circuit is moved to a normal control.

3. The leakage detection device of a vehicle-mounted power supply system according to claim 1, wherein, when an operation for stopping a vehicle from working is performed, all the switching elements in the power conversion circuit are turned on while the contactor is turned off;

it is detected whether or not the leakage exists in the power supply system; and after it is detected whether or not the leakage exists in the power supply system, the vehicle is stopped from working.

4. The leakage detection device of a vehicle-mounted power supply system according to claim 2, wherein, the control of the switching elements in the electric power conversion circuit is moved to the normal control only if the leakage detection means detects that the leakage does not exist in the power supply system.

5. The leakage detection device of a vehicle-mounted power supply system according to claim 1, wherein, if the leakage is detected to exist by the leakage detection means, all the switching elements in the electric power conversion circuit are turned off;

it is detected whether or not the leakage exists in the power supply system on the basis of the voltage value at the voltage measurement point with all of the switching elements being turned off;

as a result, if the leakage is detected to exist with all of the switching elements being turned off, it is determined that the leakage exists before the electric power conversion circuit; and if the leakage is not detected to exist with all of the switching elements being turned off, it is determined that the leakage exists in the electric power conversion circuit or after.

6. A leakage detection method of a vehicle-mounted power supply system, for detecting a leakage in the power supply system comprising a DC high voltage circuit and an AC high voltage circuit, the method comprising:

turning off a contactor provided on a positive line or a negative line in the DC high voltage circuit;

generating an AC voltage signal by an AC voltage generator;

turning on all switching elements in an electric power conversion circuit provided in the AC high voltage circuit to electrically connect all circuits in the power supply system;

applying the AC voltage signal generated by the AC voltage generator to a voltage applying point on the positive line or the negative line;

measuring a voltage at a voltage measurement point located between the AC voltage unit and the voltage applying point; and detecting whether or not the leakage exists in the power supply system on the basis of the voltage value measured at the voltage measurement point, said detecting of whether or not the leakage exists being performed while all switching elements remain turned on and the contactor remains turned off.

7. The leakage detection method of a vehicle-mounted power supply system according to claim 6, wherein said detecting of whether the leakage exists is performed during an operation for activating a vehicle, the method further comprising:

turning on the contactor after it is detected whether or not the leakage exists in the power supply system; and moving a control of the switching elements in the electric power conversion circuit to a normal control.

8. The leakage detection method of a vehicle-mounted power supply system according to claim 6, wherein said detecting of whether the leakage exists is performed during an operation for stopping a vehicle from working, the method further comprising:

stopping the vehicle from working after it is detected whether or not the leakage exists in the power supply system.

* * * * *